(12) United States Patent
Chen

(10) Patent No.: US 6,798,246 B2
(45) Date of Patent: Sep. 28, 2004

(54) BOOSTED CLOCK GENERATOR HAVING AN NMOSFET PASS GATE TRANSISTOR

(75) Inventor: Yin-Chang Chen, Hsin-Chu Hsien (TW)

(73) Assignee: AMIC Technology Corporation, Hsin-Chu (TW)

( * ) Notice: Subject to any disclaimer, the term of this patent is extended or adjusted under 35 U.S.C. 154(b) by 111 days.

(21) Appl. No.: 10/248,183

(22) Filed: Dec. 25, 2002

(65) Prior Publication Data

US 2004/0041613 A1 Mar. 4, 2004

(30) Foreign Application Priority Data

Aug. 29, 2002 (TW) ........................................ 91119725 A

(51) Int. Cl.[7] .......................................... H03K 19/0185
(52) U.S. Cl. ............................. 326/83; 326/98; 326/68
(58) Field of Search .............................. 326/63, 68–71, 326/82, 83, 86, 93–98

(56) References Cited

U.S. PATENT DOCUMENTS

| | | | | |
|---|---|---|---|---|
| 5,424,657 A | * | 6/1995 | Van Brunt et al. | 326/63 |
| 5,736,869 A | * | 4/1998 | Wei | 326/81 |
| 5,933,386 A | * | 8/1999 | Walker et al. | 365/230.01 |
| 6,351,173 B1 | * | 2/2002 | Ovens et al. | 327/333 |

* cited by examiner

Primary Examiner—Don Le
(74) Attorney, Agent, or Firm—Winston Hsu

(57) ABSTRACT

A boosted clock generator has a clock generator for generating a first clock signal, a cross-coupled boost circuit electrically connected to the clock generator for boosting the first clock signal so as to generate a second clock signal, a bootstrap pass gate having an NMOSFET pass gate transistor electrically connected to the cross-coupled boost circuit for passing a higher voltage of the second clock signal, and a level shift circuit electrically connected to the bootstrap pass gate for generating a boosted clock signal according to the higher voltage of the second clock signal.

11 Claims, 4 Drawing Sheets

BOOSTED CLOCK GENERATOR HAVING AN NMOSFET PASS GATE TRANSISTOR

BACKGROUND OF INVENTION

1. Field of the Invention

The present invention relates to a boosted clock generator, and more particularly to a boosted clock generator having an N-type metal-oxide-semiconductor field effect transistor (NMOSFET), which is taken as a pass gate transistor.

2. Description of the Prior Art

Flash memory has become a popular non-volatile memory product in recent years, and is usually used in many computer peripheral devices that have a requirement of non-volatile memory. Generally, a high voltage, i.e. about 9 volts, is necessary to charge a floating gate of a flash memory unit while data is written into the flash memory unit. However, the voltage level of the power supply is usually less than the high voltage, so a circuit designer of the flash memory usually uses a charge pump circuit to pull up the voltage level of the power supply to a proper voltage level so as to charge the floating gate of the flash memory unit. The charge pump circuit uses a clock signal to control a switch to charge and discharge a capacitor repeatedly until the direct current (DC) voltage of the output signal of the charge pump circuit reaches the high voltage. Therefore, the amplitude of the clock signal, which is used to control the switch, deeply influences the efficiency of the charge pump circuit and the maximum voltage of a boosted signal of the charge pump circuit. Moreover, low-power circuits are becoming more and more popular and result in the decrease of the power supply voltage, so it becomes more difficult to pull the power supply voltage to the high voltage. Therefore, how to generate a clock signal having greater voltage amplitude to improve the efficiency of the charge pump circuit and the maximum voltage of the boosted signal has become a major subject of the flash memory research and design. Please refer to FIG. 1. FIG. 1 indicates the relationship between the clock signal, charge pump circuit, and the high voltage, which were described above.

Please refer to FIG. 2, which is a circuit diagram of a boosted clock generator 10 according to the prior art. The boosted clock generator 10 is used to generate a boosted clock signal, which has an amplitude greater than the rail-to-rail amplitude of the power supply voltage. The boosted clock generator 10 comprises a clock generator 12 for generating a first clock signal PH and a first complementation clock signal PHB that is complementary to the first clock signal PH, a cross-coupled boost circuit 14 electrically connected to the clock generator 12 for boosting the first clock signal PH so as to generate a second clock signal CPH and a second complementation clock signal CPHB that is complementary to the second clock signal CPH, and a bootstrap pass gate 16 electrically connected to the cross-coupled boost circuit 14 for passing a higher voltage of the second clock signal CPH. The first clock signal PH and the second clock signal CPH are inphase, and the first complementation clock signal PHB and the second complementation clock signal CPHB are inphase. The bootstrap pass gate 16 comprises a pass gate transistor 18, which is a P-type metal-oxide-semiconductor field effect transistor (PMOSFET). The drain of the pass gate transistor 18 is electrically connected to the cross-coupled boost circuit 14 so as to output the second clock signal CPH, and the source of the pass gate transistor 18 is electrically connected to an output terminal COUT of the boosted clock generator 10 so as to pass the higher voltage of the second clock signal CPH. The bootstrap pass gate 16 further comprises a discharge transistor 20, which is an N-type metal-oxide-semiconductor field effect transistor (NMOSFET), electrically connected to the output terminal COUT and a grounding terminal for transmitting a grounding voltage GND. The gate of the pass gate transistor 18 and the gate of the discharge transistor 20 are electrically connected to the terminal that outputs the first complementation clock signal PHB. When the first complementation clock signal PHB is low, the channel of the pass gate transistor 18 turns on so that the higher voltage of the second clock signal CPH is transmitted to the output terminal COUT. When the first complementation clock signal PHB is high, the channel of the discharge transistor 20 turns on so that the grounding voltage GND is transmitted to the output terminal COUT. Finally, the boosted clock signal is generated.

Generally, the clock generator 12 is a non-overlap clock generator and comprises two cross-coupled NAND gates 22 and 24, an inverter 26, and two buffers 28 and 30 as shown in FIG. 2. The two buffers 28 and 30 are two inverters. The clock generator 12 is used to generate the first clock signal PH and the first complementation clock signal PHB according to the clock signal CLK. The cross-coupled boost circuit 14 usually comprises a cross-coupled pair, which is composed of two NMOSFETs 32 and 34 and two boost capacitors 36 and 38 as shown in FIG. 2. The drain of one of the two boost capacitors 36 or 38 may be coupled to the source of the other boost capacitor 38 or 36. The cross-coupled boost circuit 14 uses the first clock signal PH and the first complementation clock signal PHB to charge the two boost capacitors 36 and 38 repeatedly so as to boost the second clock signal CPH and the second complementation clock signal CPHB. The cross-coupled boost circuit 14 further comprises an activating module, which is composed of two NMOSFETs 40 and 42, electrically connected to the two output terminals of the cross-coupled boost circuit 14 for applying an activating voltage to the two output terminals of the cross-coupled boost circuit 14 to activate the cross-coupled boost circuit 14.

However, because the pass gate transistor 18 of the bootstrap pass gate 16 is a PMOSFET, a latch-up phenomenon may occur and results in errors or a breakdown of the boosted clock generator 10. To avoid the latch-up phenomenon, the circuit designer usually electrically connects the N substrate (or N-well) of the pass gate transistor 18 with a DC voltage source of the boosted clock generator 10 that has the highest voltage level. However, the voltage level of the second clock signal CPH may be double the voltage level of the power supply, i.e. 2 Vdd, so the DC voltage source cannot be less than 2 Vdd. Otherwise, the latch-up phenomenon may occur. The design of the DC voltage source, thus, is a great challenge for the circuit designers. Another circuit design for avoiding the latch-up phenomenon is electrically connecting the substrate of the pass gate transistor 18 with the source of the pass gate transistor 18. Theoretically, because the P type source and the N type substrate have the same voltage level at any time, no forward bias of the PN junction will occur so that the latch-up phenomenon can be avoided. However, the pass gate transistor 18 actually may have structural difference, which results in the equivalent resistance of the drain not being equal to the equivalent resistance of the substrate, so the transient forward bias of the PN junction may occur and lead to the latch-up phenomenon.

SUMMARY OF INVENTION

It is therefore a primary objective of the claimed invention to provide a pass gate transistor having an NMOSFET to avoid the latch-up phenomenon of the PMOSFET pass gate transistor of the prior art.

Briefly summarized, the claimed invention discloses a boosted clock generator for generating a boosted clock signal. The boosted clock generator comprises a clock generator for generating a first clock signal, a cross-coupled boost circuit electrically connected to the clock generator for boosting the first clock signal so as to generate a second clock signal, a bootstrap pass gate having an NMOSFET pass gate transistor, electrically connected to the cross-coupled boost circuit for passing a higher voltage of the second clock signal, and a level shift circuit electrically connected to the bootstrap pass gate for generating the boosted clock signal according to the higher voltage of the second clock signal.

The claimed boosted clock generator uses an NMOSFET as the pass gate transistor, to avoid the latch-up phenomenon of the prior art pass gate transistor, i.e. a PMOSFET, and uses a the level shift circuit to replace the prior art discharge transistor.

These and other objectives and advantages of the present invention will no doubt become obvious to those of ordinary skill in the art after reading the following detailed description of the preferred embodiment that is illustrated in the various figures and drawings.

DETAILED DESCRIPTION

Figure 1:
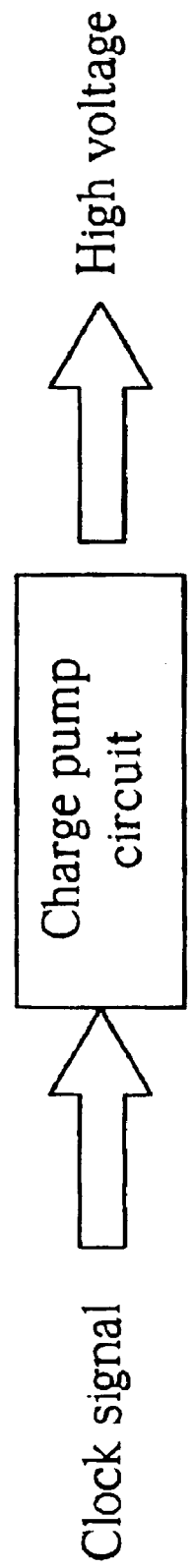
FIG. 1 is a schematic diagram of a charge pump circuit and relative signals.
Figure 2:
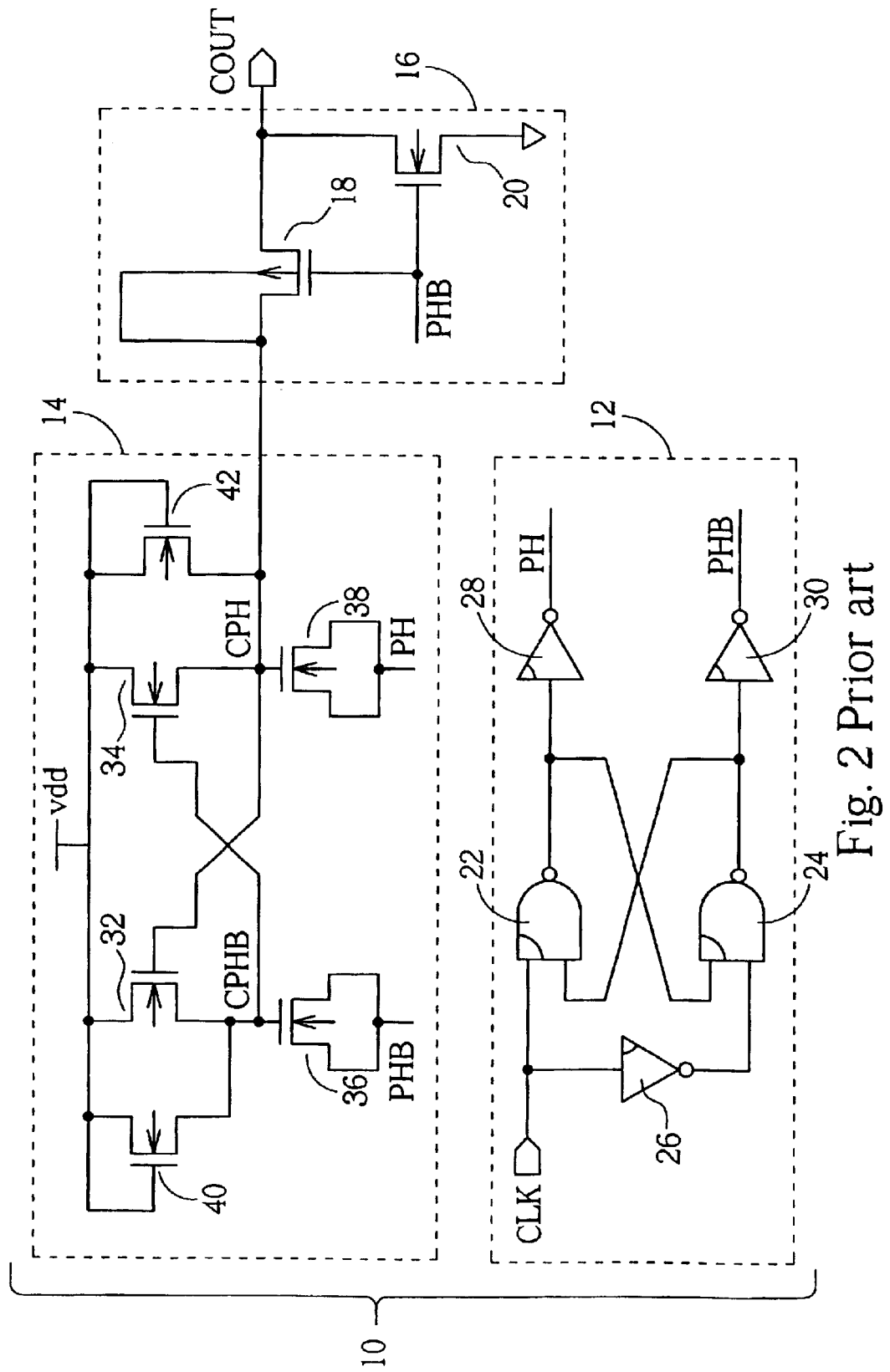
FIG. 2 is a circuit diagram of a boosted clock generator according to the prior art.
Figure 3:
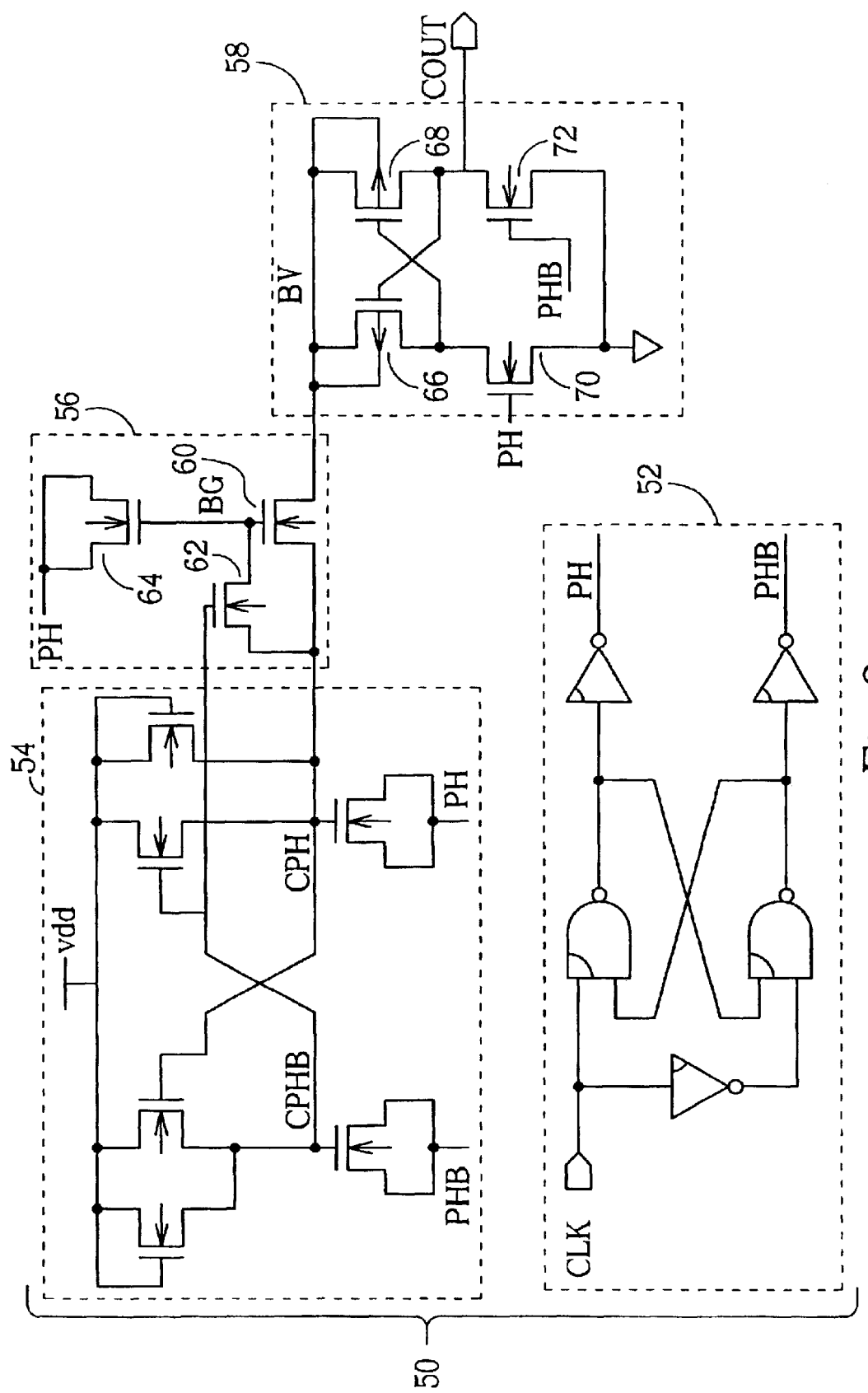
FIG. 3 is a circuit diagram of a boosted clock generator according to the present invention.

Please refer to FIG. 3, which is a circuit diagram of a boosted clock generator 50 according to the present invention. The boosted clock generator 50 is used to generate a boosted clock signal and comprises a clock generator 52, a cross-coupled boost circuit 54, a bootstrap pass gate 56, and a level shift circuit 58. Many of the characteristics of the boosted clock generator 50 are similar to the boosted clock generator 10, such as the clock generator 52 and the cross-coupled boost circuit 54, so the descriptions of these parts can be found in the description of the prior art and will be not repeated. However, the bootstrap pass gate 56 and the level shift circuit 58 are used to replace the bootstrap pass gate 16 of the boosted clock generator 10.

The bootstrap pass gate 56 comprises a pass gate transistor 60, which is an N-type metal-oxide-semiconductor field effect transistor (NMOSFET), a pre-charge transistor 62, and a boost capacitor 64. The drain of the pass gate transistor 60 is electrically connected to the cross-coupled boost circuit 54 so as to output the second clock signal CPH. The source of the pass gate transistor 60 is electrically connected to the level shift circuit 58 so as to pass the higher voltage of the second clock signal CPH. The pre-charge transistor 62 is an NMOSFET. The drain of the pre-charge transistor 62 is electrically connected to the cross-coupled boost circuit 54 so as to input the second clock signal CPH, and the gate of the pre-charge transistor 62 is also electrically connected to the cross-coupled boost circuit 54 so as to input the second complementation clock signal CPHB. The source of the pre-charge transistor 62 is electrically connected to the gate of the pass gate transistor 60 to pre-charge the gate of the pass gate transistor 60. The boost capacitor 64 may be any kind of electronic component that has capacitance effect. One of the two terminals of the boost capacitor 64 is electrically connected to the clock generator 52 to input the first clock signal PH, and the other terminal of the boost capacitor 64 is electrically connected to the gate of the pass gate transistor 60 to boost the voltage level of the gate of the pass gate transistor 60. In the preferred embodiment, the boost capacitor 64 is an NMOSFET that has its drain coupled to its source.

The level shift circuit 58 comprises a cross-coupled pair and a discharging module. The cross-coupled pair comprises two PMOSFETs 66 and 68, which are cross-coupled to each other as shown as FIG. 3. Both the sources and the substrates of the PMOSFETs 66 and 68 are electrically connected to the source of the pass gate transistor 60 to receive the higher voltage of the second clock signal CPH. Both the drains and the gates of the PMOSFET 66 and 68 are respectively electrically connected to the drains of two NMOSFETs 70 and 72 of the discharging module. The sources of the NMOSFETs 70 and 72 are electrically connected to a grounding terminal, and the gates of the NMOSFETs 70 and 72 are respectively used to receive the first clock signal PH and the first complementation clock signal PHB. An output terminal COUT is electrically connected to the drain of the transistor 68 and the drain of the transistor 72 to output the boosted clock signal.

Figure 4:
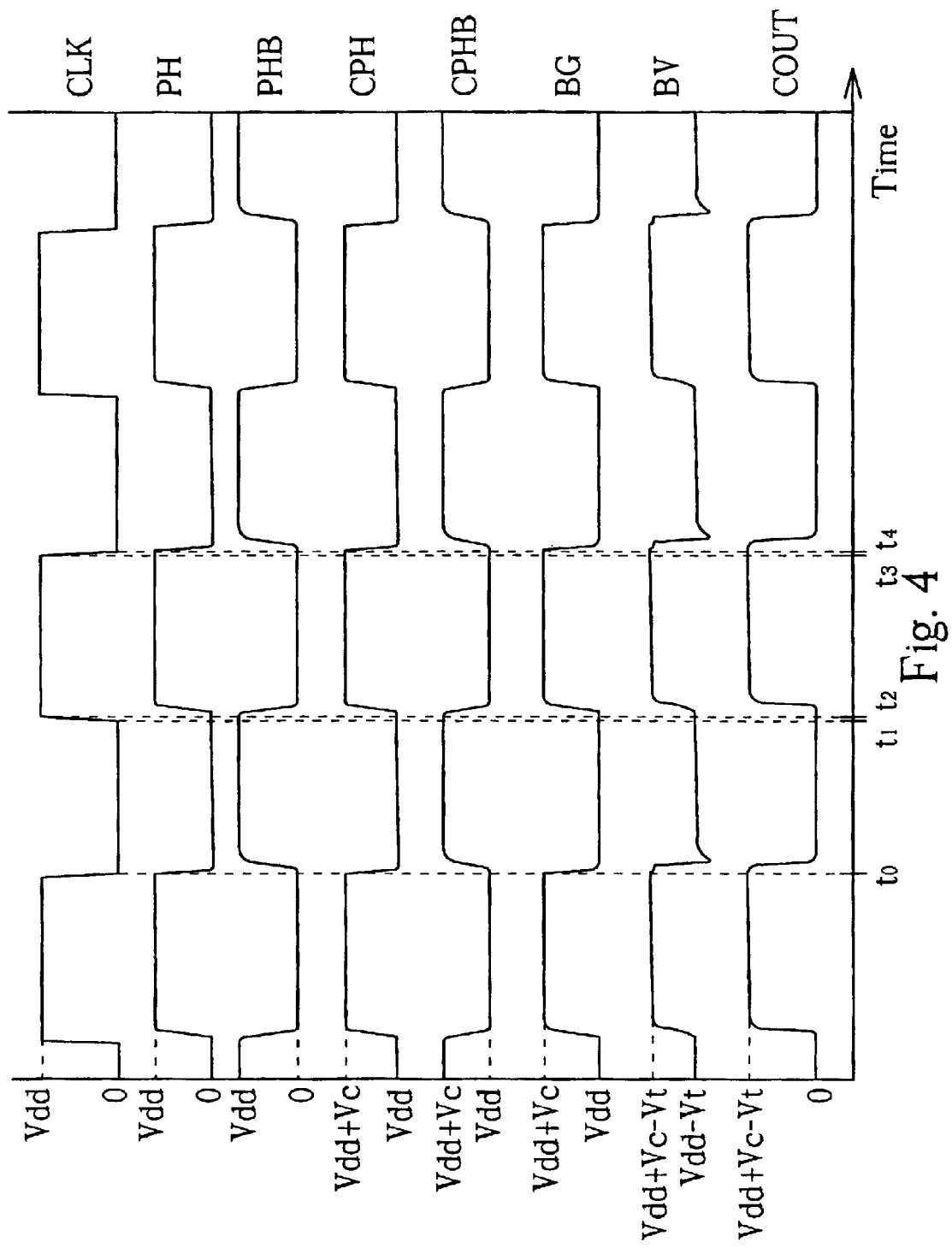
FIG. 4 is a timing diagram of related signals of the boosted clock generator in FIG. 3.

Please refer to FIG. 4, which is a timing diagram of related signals of the boosted clock generator 50. The clock signal CLK, the first clock signal PH, the first complementation clock signal PHB, the second clock signal CPH, the second complementation clock signal CPHB, the signal at a first node BG in FIG. 3, the signal at a second node BV in FIG. 3, and the boosted clock signal outputted from the terminal COUT are respectively represented from the top to the bottom in FIG. 4. The detailed descriptions of the operations of the boosted clock generator 50 will be disclosed as following. During the time interval $t_0$–$t_1$, the voltage level of clock signal CLK is a grounding voltage (i.e. 0V), the voltage level of first clock signal PH outputted from the clock generator 52 is 0V, and the voltage level of the first complementation clock signal PHB is Vdd. The first clock signal PH and the first complementation clock signal PHB are inputted into the cross-coupled boost circuit 54 so that the cross-coupled boost circuit 54 outputs the second clock signal CPH, which has a voltage level Vdd, and the second complementation clock signal CPHB, which has a voltage level (Vdd+Vc), where the voltage level Vc is the voltage gap between the two boost capacitors of the cross-coupled boost circuit 54 while the cross-coupled boost circuit 54 is charged. The voltage level Vc is dependent on a coupling ratio (CR), i.e. Vc=Vdd×CR, and 0<CR<1. Because the second complementation clock signal CPHB is inputted into the gate of the pre-charge transistor 62 and the second clock signal is inputted into the drain of the pre-charge transistor 62, the channel of the pre-charge transistor 62 is turned on and the voltage level of the gate of the pass gate transistor 60, i.e. the voltage level on the first node BG, becomes Vdd. On the other hand, because the second clock signal CPH is transmitted to the drain of the pass gate transistor 60, the channel of the pass gate transistor 60 is turned off and results in the voltage level of the source of the pass gate transistor 60, i.e. the voltage level on the second node BV, floating at (Vdd−Vt), where the voltage level Vt is the threshold voltage of the pass gate transistor 60. Finally, because the second complementation clock signal CPHB is inputted into the gate of the discharge transistor 72, the channel of the discharge transistor 72 is turned on. Moreover, because of the operations of the cross-coupled pair of the level shift circuit 58, the channel of the PMOSFET 68 is turned off and the voltage level of the boosted clock signal outputted from the output terminal COUT is 0V.

During the time interval $t_1$–$t_2$, because the voltage level of the clock signal CLK transitions from 0V to Vdd, the voltage level of first clock signal PH outputted from the clock generator 52 transitions from 0V to Vdd, the voltage level of the first complementation clock signal PHB transitions from Vdd to 0V, the voltage level of the second clock CPH transitions from Vdd to (Vdd+Vc), and the second complementation clock signal CPHB transitions from (Vdd+Vc) to Vdd. Because the second complementation clock signal CPHB is inputted into the gate of the pre-charge transistor 62 and the second clock signal CPH is inputted into the drain of the pre-charge transistor 62, the channel of the pre-charge transistor 62 is turned off. The voltage level on the first node BG transitions from Vdd to (Vdd+Vc), i.e. the voltage level of the first clock signal PH plus the voltage gap between the boost capacitor 64. Because the second clock signal CPH is inputted into the drain of the pass gate transistor 60, the channel of the pass gate transistor 60 is turned on and the voltage level on the second node BV is pulled up to (Vdd+Vc−Vt). Finally, the second complementation clock signal CPHB is inputted into the gate of the discharge transistor 72, so the channel of the discharge transistor 72 is turned off. Moreover, because of the operations of the cross-coupled pair of the level shift circuit 58, the channel of the PMOSFET 68 is turned on and the voltage level of the boosted clock signal outputted from the output terminal COUT is pulled up to (Vdd+Vc−Vt).

During the time interval $t_2$–$t_3$, the voltage level of the clock signal CLK is Vdd, the voltage level of first clock signal PH outputted from the clock generator 52 is Vdd, the voltage level of the first complementation clock signal PHB is 0V, the voltage level of the second clock CPH is (Vdd+Vc), and the second complementation clock signal CPHB is Vdd. Because the second complementation clock signal CPHB is inputted into the gate of the pre-charge transistor 62 and the second clock signal CPH is inputted into the drain of the pre-charge transistor 62, the channel of the pre-charge transistor 62 is turned off. The voltage level on the first node BG is (Vdd+Vc), i.e. the voltage level of the first clock signal PH plus the voltage gap between the boost capacitor 64. Because the second clock signal CPH is inputted into the drain of the pass gate transistor 60, the channel of the pass gate transistor 60 is turned on and the voltage level on the second node BV is (Vdd+Vc−Vt). Finally, the second complementation clock signal CPHB is inputted into the gate of the discharge transistor 72, so the channel of the discharge transistor 72 is turned off. Moreover, because of the operations of the cross-coupled pair of the level shift circuit 58, the channel of the PMOSFET 68 is turned on and the voltage level of the boosted clock signal outputted from the output terminal COUT is (Vdd+Vc−Vt).

During the time interval $t_2$–$t_3$, because the voltage level of the clock signal CLK transitions from 0V to Vdd, the voltage level of first clock signal PH outputted from the clock generator 52 transitions from Vdd to 0V, the voltage level of the first complementation clock signal PHB transitions from 0V to Vdd, the voltage level of the second clock CPH transitions from (Vdd+Vc) to Vdd, and the second complementation clock signal CPHB transitions from Vdd to (Vdd+Vc). Because the second complementation clock signal CPHB is inputted into the gate of the pre-charge transistor 62 and the second clock signal CPH is inputted into the drain of the pre-charge transistor 62, the channel of the pre-charge transistor 62 is turned on and results in the voltage level of the gate of the pass gate transistor 60, i.e. the voltage level on the first node BG, is pulled down to Vdd. Because the second clock signal CPH is inputted into the drain of the pass gate transistor 60, the channel of the pass gate transistor 60 is turned off and results in the voltage level on the second node BV floating at (Vdd−Vt). Finally, the second complementation clock signal CPHB is inputted into the gate of the discharge transistor 72, so the channel of the discharge transistor 72 is turned on. Moreover, because of the operations of the cross-coupled pair of the level shift circuit 58, the channel of the PMOSFET 68 is turned off and the voltage level of the boosted clock signal outputted from the output terminal COUT is pulled down to 0V. Summarized, the boosted clock generator 50 outputs the boosted clock signal from the output terminal COUT.

In contrast to the prior art, the claimed invention provides a boosted clock generator using an NMOSFET as a pass gate transistor to avoid the latch-up phenomenon of the prior art pass gate transistor, i.e. a PMOSFET. Moreover, because the prior art pass gate transistor is a PMOSFET, a high pulse current flowing through the cross-coupled pair and the discharging module to the grounding terminal may occur during the signal transition of the prior art boosted clock generator, where the high pulse current may be a possible noise source. The claimed invention uses an NMOSFET as the pass gate transistor, so the noise of the pulse current can be minimized.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A boosted clock generator for generating a boosted clock signal, comprising:
   a clock generator for generating a first clock signal;
   a cross-coupled boost circuit electrically connected to the clock generator for boosting the first clock signal so as to generate a second clock signal;
   a bootstrap pass gate having a pass gate transistor, which is an N-type metal-oxide-semiconductor field effect transistor (NMOSFET), electrically connected to the cross-coupled boost circuit for passing a higher voltage of the second clock signal; and
   a level shift circuit electrically connected to the bootstrap pass gate for generating the boosted clock signal according to the higher voltage of the second clock signal.

2. The boosted clock generator of claim 1 wherein the clock generator further generates a first complementation clock signal that is complementary to the first clock signal, and the cross-coupled boost circuit further generates a second complementation clock signal that is complementary to the second clock signal.

3. The boosted clock generator of claim 2 wherein a drain of the pass gate transistor is electrically connected to the cross-coupled boost circuit so as to receive the second clock signal, and a source of the pass gate transistor is electrically connected to the level shift circuit so as to transmit the higher voltage of the second clock signal.

4. The boosted clock generator of claim 3 wherein the bootstrap pass gate further comprises:

a pre-charge transistor, which is an NMOSFET, a drain of the pre-charge transistor is electrically connected to the cross-coupled boost circuit so as to receive the second clock signal, a gate of the pre-charge transistor is electrically connected to cross-coupled boost circuit so as to receive the second complementation clock signal, and a source of the pre-charge transistor is electrically connected to a gate of the pass gate transistor so as to pre-charge the gate of the pass gate transistor; and a boost capacitor having a first end electrically connected to the clock generator for receiving the first clock signal, and a second end electrically connected to the gate of the gate pass transistor for boosting a potential of the gate of the gate pass transistor.

5. The boosted clock generator of claim 4 wherein the boost capacitor is an NMOSFET, and a drain of the boost capacitor is electrically connected to a source of the boost capacitor.

6. The boosted clock generator of claim 2 wherein the clock generator is a non-overlap clock generator for generating the first clock signal and the first complementation clock signal.

7. The boosted clock generator of claim 2 wherein the cross-coupled boost circuit further comprises:

a cross-coupled pair having a first NMOSFET and a second NMOSFET for generating the second clock signal and the second complementation clock signal, a gate of the first NMOSFET is electrically connected to a drain of the second NMOSFET, and a drain of the first NMOSFET is electrically connected to a gate of the second NMOSFET; and two boost capacitors each electrically connected to a corresponding output terminal of the cross-coupled pair for boosting a potential of the output terminal.

8. The boosted clock generator of claim 7 wherein each of the boost capacitors is an NMOSFET, and drains of the boost capacitors are electrically connected to sources of the boost capacitors.

9. The boosted clock generator of claim 7 wherein the cross-coupled boost circuit further comprises an activating module for applying an activating voltage to the output terminals of the cross-coupled pair, and the activating module has two N-type metal-oxide-semiconductor field effect transistors electrically connected to the output terminals of the cross-coupled pair.

10. The boosted clock generator of claim 2 wherein the level shift circuit comprises:

a cross-coupled pair having a first NMOSFET and a second NMOSFET for generating the boosted clock signal according to the higher voltage of the second clock signal, a gate of the first NMOSFET is electrically connected to a drain of the second NMOSFET, and a drain of the first NMOSFET is electrically connected to a gate of the second NMOSFET; and a discharging module for discharge of the cross-coupled pair having two N-type metal-oxide-semiconductor field effect transistors, gates of the two transistors of the discharging module are electrically connected to the clock generator, and drains of the two transistors of the discharging module are electrically connected to the two drains of the cross-coupled pair.

11. The boosted clock generator of claim 1 wherein the boosted clock signal is transmitted to a charge pump circuit so as to generate a boosted voltage having higher direct current voltage than a supply voltage.

* * * * *